United States Patent
Awada et al.

(10) Patent No.: US 6,895,290 B2
(45) Date of Patent: May 17, 2005

(54) LIMITING THE DAMAGING EFFECTS OF LOUD MUSIC FROM AUDIO SYSTEMS, PARTICULARLY FROM AUTOMOBILE AUDIO SYSTEMS

(75) Inventors: Faisal M. Awada, Round Rock, TX (US); Joe Nathan Brown, Austin, TX (US); Philip Bernard Burkes, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 487 days.

(21) Appl. No.: 10/195,187

(22) Filed: Jul. 11, 2002

(65) Prior Publication Data

US 2004/0007916 A1 Jan. 15, 2004

(51) Int. Cl.$^7$ .............................................. G06F 17/00
(52) U.S. Cl. ............................ 700/94; 381/56; 381/61; 381/101; 381/102; 381/104; 381/107; 84/633; 84/665
(58) Field of Search ............................. 700/94; 381/56, 381/61, 101, 102, 104, 107; 84/633, 665

(56) References Cited

U.S. PATENT DOCUMENTS 4,542,525 A * 9/1985 Hopf ........................... 381/56
5,434,926 A * 7/1995 Watanabe et al. ........... 381/108
6,139,505 A * 10/2000 Murphy ....................... 600/532

* cited by examiner

Primary Examiner—Brian Sircus
Assistant Examiner—Marc L Shin
(74) Attorney, Agent, or Firm—Jerry B. Kraft; Mark E. McBurney

(57) ABSTRACT

Minimizing the damaging effects of loud music but with minimal reduction in aesthetic quality of the music. When music presented through an audio is sampled in order to determine average frequency, music having very low average frequencies is predictably likely to be played louder than sampled music having higher average frequencies. This unexpected observation is based upon a human factor, i.e. rock and related music that is ordinarily composed and presented at relatively low frequencies, e.g. 500 to 1000 Hz is likely to be played on the audio system at very high volume because of the tastes of its listeners. An audio system for a data processor controlled presentation of music with a set up for minimizing the damaging effects of loud music comprising an implementation for predetermining a minimum average frequency of music being presented in combination with measuring whether the music being presented falls below said minimum average frequency for a sampling period. Then, based on the above recognition, there is provided a device for automatically limiting the music being presented to an audio volume below a predetermined level when said measured average frequency for said sampling period is below said minimum average frequency.

30 Claims, 3 Drawing Sheets

LIMITING THE DAMAGING EFFECTS OF LOUD MUSIC FROM AUDIO SYSTEMS, PARTICULARLY FROM AUTOMOBILE AUDIO SYSTEMS

TECHNICAL FIELD

The present invention relates to audio systems for the playing or presentation of music, and particularly to minimizing the damaging effects of such music.

BACKGROUND OF RELATED ART

The past decade has been marked by the convergence of computer and electronic entertainment technologies. The continually decreasing cost of "computer power" has led to very extensive aesthetic advances in the electronic entertainment technologies at little or no additional cost to the consumer. Audio systems for the playing of music have reaped the benefit of these technical advances. Audio systems of higher and higher quality and sophistication are being marketed and installed in automobiles. Of course, with the benefit of quality, there are attendant detriments. There is a clear tenancy on the part of audio system users to listen to music at volumes that not only distract a driver's attention from the road to the music, but is so loud that it covers or masks sounds like the sirens of emergency vehicles that a driver must be alert to.

This is particularly true in the case of young people listening to music in the broad category of rock music. In addition, within the closed confines of an automobile, the loudness is reinforced by the reverberations within the body housing. Of course, in the case of listeners of music such as rock music, there is the continuing effect of loud music above 85–90 decibels doing long term damage to the hearing of the listeners.

Among existing methods addressing these problems are systems that just filter out the audio system music volumes that would produce loudness above, for example, 80 decibels. This may unduly limit the quality of the music since even relatively low decibel played music may occasionally go above such levels for short periods for accent purposes.

Other proposed solutions involve the recognition that relative loudness increases with increases in frequency so that, for example, music having a frequency of 2500 Hz will be louder than music of the same amplitude but having a lower frequency of 2000 Hz.

SUMMARY OF THE PRESENT INVENTION

The present invention has found a solution that minimizes the damaging effects of loud music but with minimal reduction in the aesthetic quality of the music. The invention is based on the unexpected recognition that when music presented through an audio system is sampled in order to determine average frequency, music having very low average frequencies is predictably likely to be played louder than sampled music having higher average frequencies. This unexpected observation is not based upon any physical law but rather based upon a human factor, i.e. rock and related music that is ordinarily composed and presented at relatively low frequencies, e.g. 500 to 1000 Hz is likely to be played on the audio system at a very high volume because of the tastes of its listeners.

Accordingly, the present invention is directed to an audio system for a data processor controlled presentation of music having a set up for minimizing the damaging effects of loud music, the system comprises means for predetermining a minimum average frequency of music being presented in combination with means for measuring whether the music being presented falls below said minimum average frequency for a sampling period. Then, based on the above recognition, there is provided means for automatically limiting the music being presented to an audio volume below a predetermined level when the measured average frequency for said sampling period is below said minimum average frequency.

The present invention is particularly effective in reducing undesirable loudness in automobile audio systems, particularly young drivers likely to be listening to the low frequency rock-like music. These are the people who are likely to be turning the volume way up. The present invention permits the host or person responsible for the audio system to enable the present system for tracking and limiting the audio presentation when the user is likely to be blasting the volume, or disable the system whenever the proposed listeners are likely to be users who will not be turning their volume way up.

In the practice of the present invention, the host or owner of the system may be enabled to set the predetermined minimum average frequency limit; for anticipated rock music, this would be in the range of from 500 to 1000 Hz. Then, when the music is played or presented on the audio system, a sample patch may be taken and measured over the time period of the sample to determine the average frequency. When this average frequency drops below the predetermined minimum frequency, then the volume to which the music may be turned up is capped, e.g. volumes that will produce a loudness above 85 decibels are filtered out.

Dependent upon the sophistication of the audio measuring system, the sampling for average frequency of the music being presented may be done once at the beginning of each piece or segment of music or it may be done periodically throughout the music presentation, and the determination of whether to limit the audio volume made during each of the periods. For other audio systems, the sampling period for average frequency could be carried out by the manufacturer of, let us say, a compact disc and the recorded CD could include an indication of the determined average frequency. In this connection, even where the music is a broadcast of a recorded CD, the broadcast could include the determined average frequency of the recorded music provided by the CD manufacturer.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT

Figure 1:
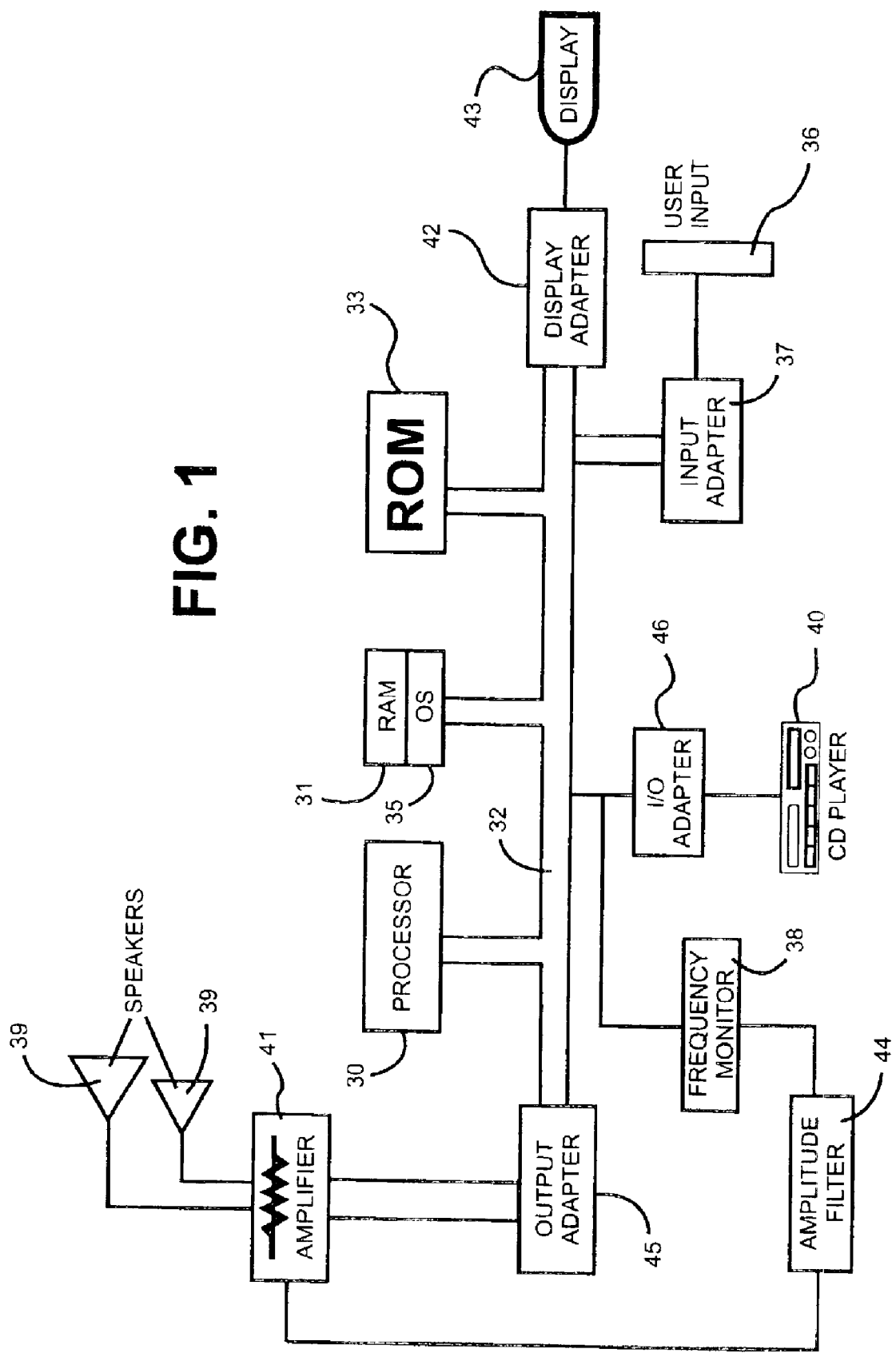
FIG. 1 is a block diagram of a generalized data processing system including a processor unit that provides the onboard automobile computer control for audio systems of the present invention.

Referring to FIG. 1, there is provided a diagrammatic view of a typical computer control system that may function as an automobile onboard controller for various automotive functions, including the automatic control of the audio volume of played music in accordance with the present invention. The audio system includes CD player 40, frequency monitor 38, amplitude filter 44, amplifier 41 and speakers 39. Control of this audio system, as will be hereinafter described, is provided by a central processing unit 30 interconnected to various other components by system bus 32. An operating system 35 runs on processor 30, provides control and is used to coordinate the functions of the various components of the control system. The OS 35 is stored in Random Access Memory (RAM) 31, which, in a typical automobile control system, has from four to eight megabytes of memory. The programs for the various automobile monitor and control functions, including those of the present invention, are permanently stored in Read Only Memory (ROM) 33 and moved into and out of RAM to perform their respective functions. The automobile has a basic display 43 controlled through display adapter 42 to provide information to the driver. Interactively responsive to the display information, the user provides commands to the automobile control system through a user input 36 that may conveniently be implemented by standard dashboard buttons connected via an appropriate input adapter 37. These commands include those enabling and disabling the volume control and commands setting the minimum average frequencies for sampling periods to be subsequently described. Sensed and input data is processed and the appropriate responsive control signals are distributed through adapter 45 to control amplifier 41 to speakers 39 as limited by amplitude filter 44. In the operation of the present invention, let us assume that a CD is being played on player 40 and input via I/O adapter 46, and the user has enabled the system and set the minimum average frequency for the music.

In this connection, it should be noted that the user who inputs the limits is not necessarily the listener. Often, and particularly when the listeners are younger people, the control input may be entered in advance by the adult who is the host or owner of the audio system in automobiles or otherwise. Accordingly, the entry of the limits and other data may be safeguarded by requiring a password or the like.

Under control of processor 30, frequency monitor 38 monitors the frequency over a set sampling period. This may be done once initially for each piece of music or it may be done in cycled periods. Alternatively, the CD manufacturer may do the sampling and embed an indication of the minimum average frequency in the CD so that it may be read by the control system. Likewise, if the music is a received broadcast, the broadcaster may include such an indicator in the broadcasted music data. In any of these cases, when the system through the frequency monitor or otherwise determines that the average frequency is below the predetermined minimum average frequency for the sampling period, the control system has the amplitude filter 44 limit the amplifier so that the volume is limited to keep the loudness below a set number of decibels. The relationship of volume amplitude to amplifier power, voltage or current is well known, and is considered in detail in the article, "Decibels Demystified, Part 1", by Scott Wilkenson, in the periodical, *Electronic Musician*, Jul. 1, 2001. Amplifier 41 may be controlled by filter 44 to limit decibels by limiting power according to the definition:

Number of decibels=10 log (P1/P0), where P1 is the maximum power amplitude with respect to base amplitude P0.

Alternatively, amplifier voltage may be limited:

Number of decibels=20 log (V1/V0), where V1 is the maximum voltage amplitude with respect to base voltage V0.

Figure 2:
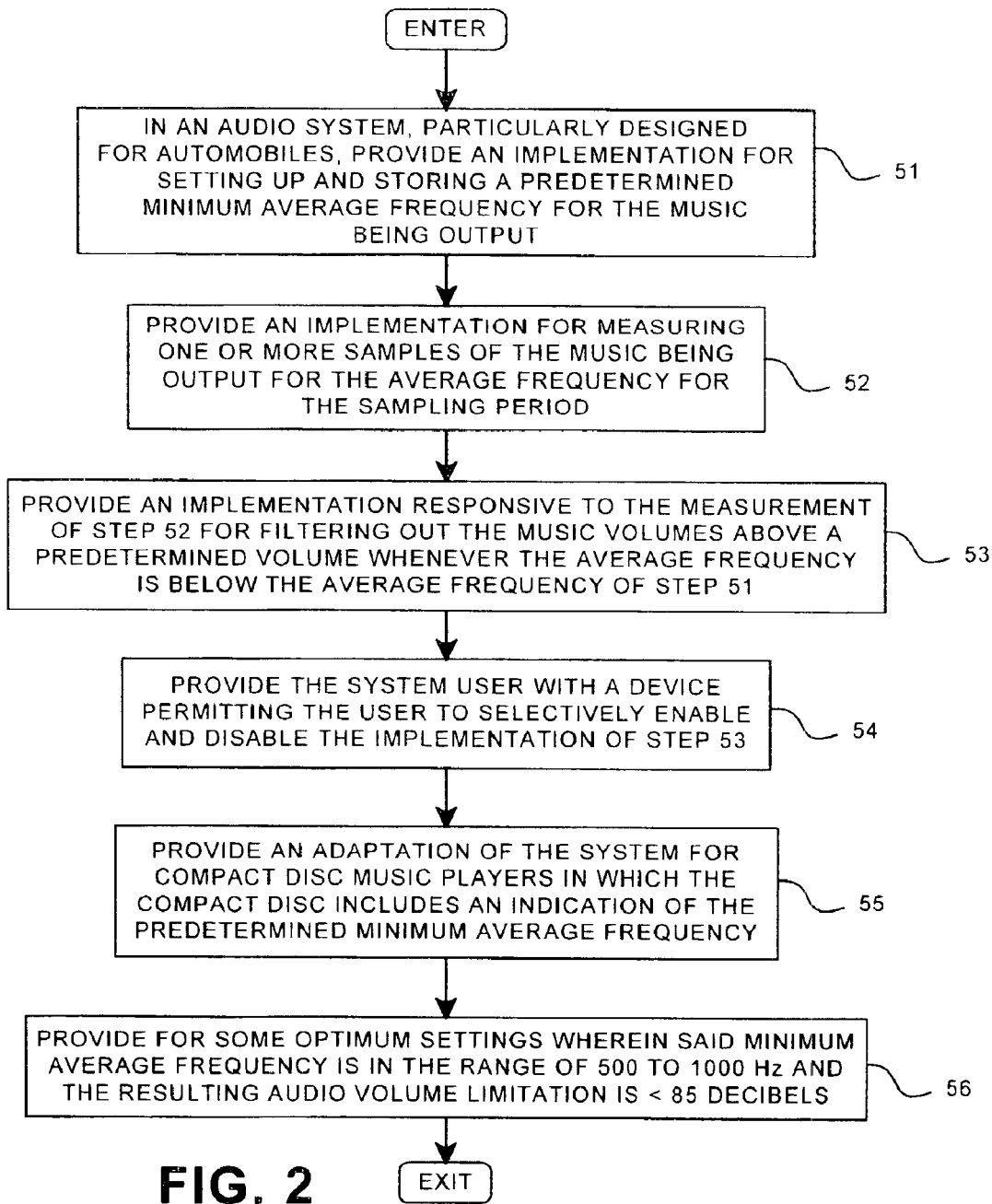
FIG. 2 is an illustrative flowchart describing the setting up of the elements needed for the program of the invention for minimizing the damaging effects of loud music.

FIG. 2 is a flowchart showing the setting up of a process according to the present invention for the automatic control of the audio volume of played music. In an audio system, and particularly one set up in automobiles, there is provided an implementation for setting and storing a predetermined minimum for the average frequency for the music being output, step 51. An implementation for measuring one or more samples of the music being output to determine average frequency over the sampling period is also set up, step 52. An implementation is provided, step 53, in response to the measurement of step 52 for filtering out music volumes above a predetermined volume whenever the average frequency is below the average frequency of step 51. The control system is provided, step 54, with a device permitting the host to selectively enable or disable the implementation of step 53.

An adaptation of the control system is provided for compact disc playing wherein the compact disc includes an indication of the predetermined minimum average frequency, step 55.

The control system also provides for some optimum settings wherein the minimum average frequency is in the range of 500 to 1000 Hz, the resulting audio volume limitation is below 85 decibels, step 56.

Figure 3:
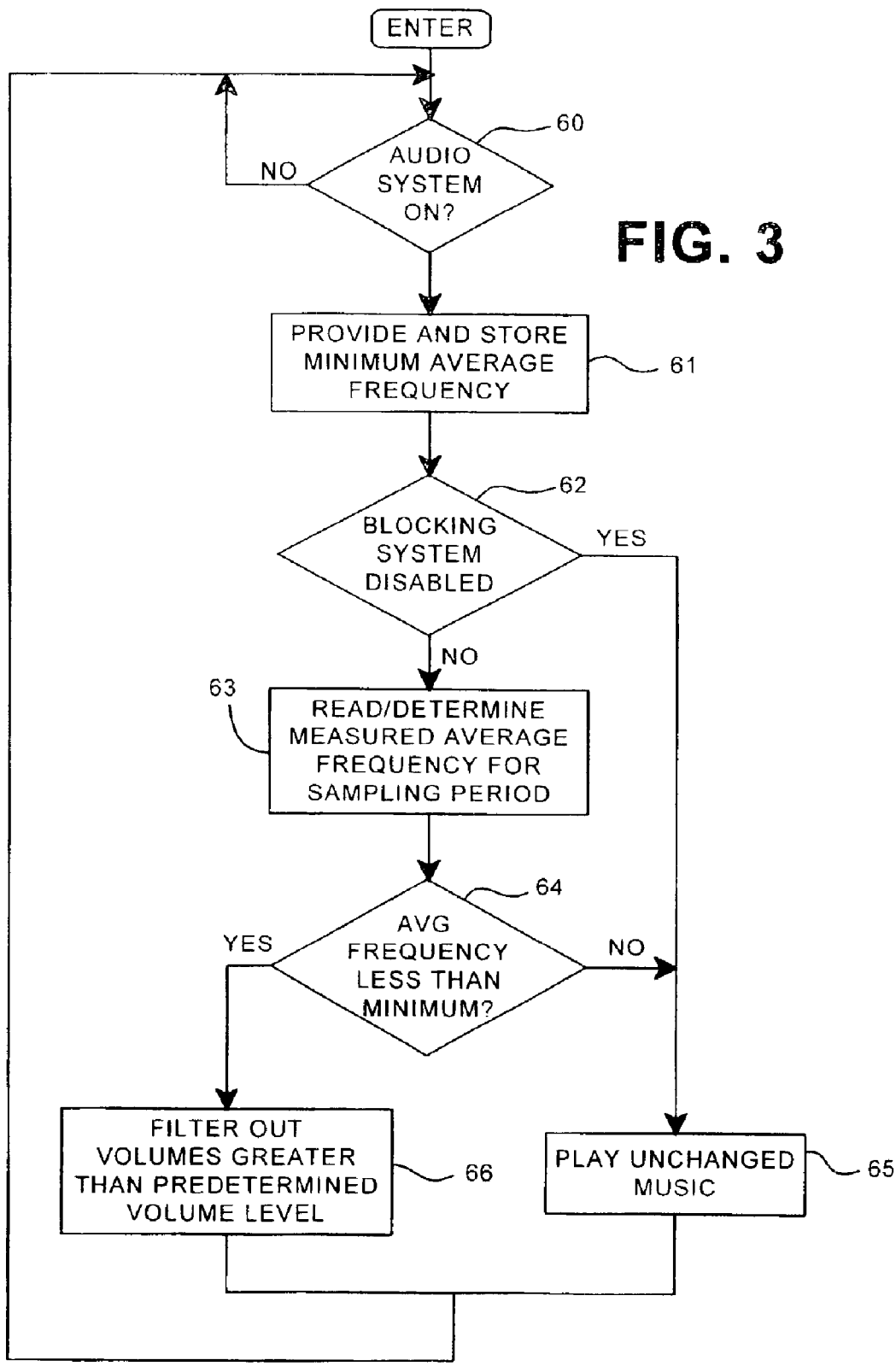
FIG. 3 is a flowchart of an illustrative run of the program set up in FIG. 2.

The running of the process set up in FIG. 2 will now be described with respect to the flowchart of FIG. 3. The flowchart represents some illustrative steps in a simple routine that will illustrate the operation of the invention as set forth in the above process. First a determination is made as to whether the music is turned on in the audio system, step 60. If No, the turn on is awaited. If Yes, then the minimum average frequency limit is input and stored, step 61. A determination is made as to whether the volume limiting system of the invention has been disabled, step 62. If No, then the minimum measured average frequency for the sampling period is determined, step 63. A determination is then made, step 64, as to whether the average frequency for the sampling period is less than the set minimum, step 64. If No, or if the determination in step 62 had been No, the music is played unchanged, step 65. If the determination in step 64 is Yes, the average frequency is less than the set minimum, then, step 66, volumes greater than the predetermined volume levels are filtered out. This may be done as previously described by controlling decibel level through control of the amplifier power or voltage amplification swings. At this point, the process is returned to step 60 and continued as described above.

Although certain preferred embodiments have been shown and described, it will be understood that many changes and modifications may be made therein without departing from the scope and intent of the appended claims.

What is claimed is:

1. In an audio system for a data processor controlled presentation of music a set up for minimizing the damaging effects of loud music comprising:

means for predetermining a minimum average frequency of music being presented;

means for measuring whether the music being presented falls below said minimum average frequency for a sampling period; and means for automatically limiting the music being presented to an audio volume below a predetermined level when said measured average frequency for said sampling period is below said minimum average frequency.

2. The audio system of claim 1 further including means enabling a user to selectively enable and disable said means for automatically limiting said volume.

3. An automobile having incorporated therein an audio system for a data processor controlled presentation of music a set up for minimizing the damaging effects of loud music comprising:

means for predetermining a minimum average frequency of music being presented;

means for measuring whether the music being presented falls below said minimum average frequency for a sampling period; and means for automatically limiting the music being presented to an audio volume below a predetermined level when said measured average frequency for said sampling period is below said minimum average frequency.

4. The audio system of claim 3 further including means enabling a user to selectively enable and disable said means for automatically limiting said volume.

5. The audio system of claim 3 further including:

means for measuring subsequently presented music to determine whether said subsequently presented music is below said minimum average; and means for unlimiting the audio volume of the subsequently presented music if said measured average frequency for said sampling period is no longer below said minimum average frequency.

6. The audio system of claim 4 wherein said minimum frequency is a selected frequency in the range of from 500 to 1000 Hz.

7. The audio system of claim 4 wherein said audio system includes a compact disc player, said music is recorded on a compact disc played in said player, said compact disc having an indication of said minimum average frequency for a sampling period.

8. The audio system of claim 6 wherein said means for limiting said audio volume limit said volume to a level providing less than 85 decibels.

9. A method for minimizing the damaging effects of loud music presented through a data processor controlled audio system comprising:

predetermining a minimum average frequency of music being presented;

measuring whether the music being presented falls below said minimum average frequency for a sampling period; and automatically limiting the music being presented to an audio volume below a predetermined level when said measured average frequency for said sampling period is below said minimum average frequency.

10. The method of claim 9 further including the step of enabling a user to selectively enable and disable the step of automatically limiting said volume.

11. A method for minimizing the damaging effects of loud music presented through a data processor controlled audio system in an automobile comprising:

predetermining a minimum average frequency of music being presented;

measuring whether the music being presented falls below said minimum average frequency for a sampling period; and automatically limiting the music being presented to an audio volume below a predetermined level when said measured average frequency for said sampling period is below said minimum average frequency.

12. The method of claim 11 further including the step of enabling a user to selectively enable and disable the step of automatically limiting said volume.

13. The method of claim 10 further including the steps of:

measuring subsequently presented music to determine whether said subsequently presented music is below said minimum average; and unlimiting the audio volume of the subsequently presented music if said measured average frequency for said sampling period is no longer below said minimum average frequency.

14. The method of claim 12 wherein said minimum frequency is a selected frequency in the range of from 500 to 1000 Hz.

15. The method of claim 12 wherein said audio system includes a compact disc player, said music is recorded on a compact disc played in said player, and including the step of indicating said minimum average frequency for a sampling period in said compact disc.

16. The method of claim 14 wherein said step of limiting said audio volume limits said volume to a level providing less than 85 decibels.

17. A computer program having code recorded on a computer readable medium for minimizing the damaging effects of loud music presented through a data processor controlled audio system comprising:

means for predetermining a minimum average frequency of music being presented;

means for measuring whether the music being presented falls below said minimum average frequency for a sampling period; and means for automatically limiting the music being presented to an audio volume below a predetermined level when said measured average frequency for said sampling period is below said minimum average frequency.

18. The computer program of claim 17 further including means enabling a user to selectively enable and disable said means for automatically limiting said volume.

19. A computer program having code recorded on a computer readable medium for minimizing the damaging effects of loud music presented through a data processor controlled audio system in an automobile comprising:

means for predetermining a minimum average frequency of music being presented;

means for measuring whether the music being presented falls below said minimum average frequency for a sampling period; and means for automatically limiting the music being presented to an audio volume below a predetermined level when said measured average frequency for said sampling period is below said minimum average frequency.

20. The computer program of claim 19 further including means enabling a user to selectively enable and disable said means for automatically limiting said volume.

21. The computer program of claim 19 further including:

means for measuring subsequently presented music to determine whether said subsequently presented music is below said minimum average; and means for unlimiting the audio volume of the subsequently presented music if said measured average frequency for said sampling period is no longer below said minimum average frequency.

22. The computer program of claim 20 wherein said minimum frequency is a selected frequency in the range of from 500 to 1000 Hz.

23. The computer program of claim 20 wherein said audio system includes a compact disc player, said music is recorded on a compact disc played in said player, said compact disc having an indication of said minimum average frequency for a sampling period.

24. The computer program of claim 22 wherein said means for limiting said audio volume limits said volume to a level providing less than 85 decibels.

25. An automobile having incorporated therein an audio system for a data processor controlled presentation of music a set up for minimizing the damaging effects of loud music comprising:

an implementation for predetermining a minimum average frequency of music being presented;

a device for measuring whether the music being presented falls below said minimum average frequency for a sampling period; and a device for automatically limiting the music being presented to an audio volume below a predetermined level when said measured average frequency for said sampling period is below said minimum average frequency.

26. The audio system of claim 25 further including a device enabling a user to selectively enable and disable said means for automatically limiting said volume.

27. The audio system of claim 25 further including:

a device for measuring subsequently presented music to determine whether said subsequently presented music is below said minimum average, and a device for unlimiting the audio volume of the subsequently presented music if said measured average frequency for said sampling period is no longer below said minimum average frequency.

28. The audio system of claim 26 wherein said minimum frequency is a selected frequency in the range of from 500 to 1000 Hz.

29. The audio system of claim 26 wherein said audio system includes a compact disc player, said music is recorded on a compact disc played in said player, said compact disc having an indication of said minimum average frequency for a sampling period.

30. The audio system of claim 28 wherein said means for limiting said audio volume limit said volume to a level providing less than 85 decibels.

* * * * *